US008245161B1

(12) United States Patent
Tortonese et al.

(10) Patent No.: US 8,245,161 B1
(45) Date of Patent: Aug. 14, 2012

(54) VERIFICATION OF COMPUTER SIMULATION OF PHOTOLITHOGRAPHIC PROCESS

(75) Inventors: Marco Tortonese, Mountain View, CA (US); Rene Blanquies, San Jose, CA (US)

(73) Assignee: KLA-Tencor Corporation, San Jose, CA (US)

(*) Notice: Subject to any disclaimer, the term of this patent is extended or adjusted under 35 U.S.C. 154(b) by 904 days.

(21) Appl. No.: 12/190,017

(22) Filed: Aug. 12, 2008

Related U.S. Application Data

(60) Provisional application No. 60/956,351, filed on Aug. 16, 2007.

(51) Int. Cl.
*G06F 17/50* (2006.01)
(52) U.S. Cl. .......................................... 716/51
(58) Field of Classification Search ............... 716/51
See application file for complete search history.

(56) References Cited

U.S. PATENT DOCUMENTS

| | | | |
|---|---|---|---|
| 6,750,447 B2 | 6/2004 | Houge et al. | |
| 6,770,868 B1 | 8/2004 | Bevis et al. | |
| 7,049,157 B2 | 5/2006 | Lu et al. | |
| 7,301,638 B1 | 11/2007 | Tortonese et al. | |
| 7,372,016 B1 | 5/2008 | Tortonese et al. | |
| 7,453,571 B1 | 11/2008 | Tortonese et al. | |
| 7,962,863 B2 * | 6/2011 | Su et al. ........................ | 716/50 |
| 2002/0194576 A1 * | 12/2002 | Toyama ........................ | 716/21 |
| 2003/0058437 A1 | 3/2003 | Tortonese et al. | |
| 2006/0062445 A1 * | 3/2006 | Verma et al. .................. | 382/144 |
| 2009/0024967 A1 * | 1/2009 | Su et al. ....................... | 716/4 |

FOREIGN PATENT DOCUMENTS

WO 99/02970 1/1999

OTHER PUBLICATIONS

Marco Tortonese U.S. Appl. No. 60/956,351, filed Aug. 16, 2007.
Allen et al., "Sheet and Line Resistance of Patterned SOI Surface Film CD Reference Materials as a Function of Substrate Bias," 1999, in Proceedings if the IEEE 1999 Conference one Microelectronic Test Structuers. vol. 12, Mar. 1999. pp. 51-55.
Allen et al., "Evaluation of Surface Depletion Effects in Single-Crystal Test Structures for Reference Materials Applications," in Characterization and Metrology for ULSI Technology: 1998 International Conference. 1998, pp. 357-362., American Institute of Physics, College Park, MD.

(Continued)

*Primary Examiner* — Jack Chiang
*Assistant Examiner* — Brandon Bowers
(74) *Attorney, Agent, or Firm* — Joshua D. Isenberg; JDI Patent (57) ABSTRACT

A method for calibrating a computer program that simulates a physical process and a photomask are disclosed. A first physical artifact may be exposed to the physical process to produce a second physical artifact. The first physical artifact may include one or more features characterized by traceably measured known dimensions. One or more features of the second physical artifact may be measured to produce one or more measured dimensions. The physical process may be simulated with a computer simulation using the known dimensions of the first physical artifact as inputs to produce an output. The output may be compared to the measured dimensions of the second physical artifact to produce a result. A figure of merit may be assigned to the computer simulation based on the result. The photomask may have one or more features with one or more traceably measured dimensions.

21 Claims, 4 Drawing Sheets

OTHER PUBLICATIONS

Allen et al., "Comparison of Properties of Electrical Test Structures Patterned in BESOI and SMOX Films for CD Reference-Material Applications," SPIE vol. 3332, 1998, pp. 124-131.

UCSB College of Engineering Press Release: "Researchers Discover How to Make the Smallest, Most Perfect, Densest nanowire Lattices—And It's a SNAP", Mar. 13, 2003, http://www.engineering.ucsb.edu/Announce/nanowire.html/.

Cresswell et al. "Electrical Linewidth Test Structures Fabricated in Monocrystalline Films for Reference-Material Applicaitons", 1998, pp. 182-193.

MAG.star-solid.I.star-solid.CAL.RTM. Deluxe, A Magnicication Calibration Sample for Transmission Electron Microscpes, from http://www.emdiasum.com/ems/calibration/magical.html, Nov. 14, 2003.

MAG*I*CAL.RTM. Deluxe, A Magnification Calibration Sample for Transmission Electron Microscopes, from http://www.emdiasum.com/ems/calibration/magical.html, Nov. 14, 2003.

Certificate Standard Reference Material® 2031a "Metal-on-Fused-Silica Filters for Spectrophotometry", National Institute of Standards & Technology, Gaithersburg, MD, Apr. 3, 2002, pp. 1-8.

Certificate Standard Reference Material® 2059, "Photomask Linewidth Calibration Standard", National Institute of Standards & Technology, Gaithersburg, MD, Nov. 13, 2006.

* cited by examiner

VERIFICATION OF COMPUTER SIMULATION OF PHOTOLITHOGRAPHIC PROCESS

PRIORITY CLAIM

This application claims the benefit of priority of commonly assigned U.S. Provisional Patent Application 60/956,351, filed Aug. 16, 2007, the entire disclosures of which are incorporated herein by reference.

FIELD OF THE INVENTION

This invention generally relates to photolithography and more particularly to verification of computer simulations of photolithographic processes.

BACKGROUND OF THE INVENTION

Existing chip design process flow may be summarized as follows. 1) A chip designer typically starts with an intended design for a chip. 2) A reticle simulator program may be used to convert the intended design to a reticle layout, which may be stored as a design file. 3) A reticle is manufactured using the reticle layout. 4) The reticle may then be used to print a pattern on a substrate such as a semiconductor wafer. 5) The printed pattern may then be compared to the intended design. If the comparison shows that the printed pattern is sufficiently close to the intended design, the reticle may be used for production. If the printed pattern is not sufficiently close to the intended design, the reticle simulator program may use differences between the printed pattern and the intended design to modify the reticle layout. Steps 2), 3) 4) and 5) may be repeated iteratively until the printed pattern is sufficiently close to the intended design.

This process flow may be first performed on a test structure and on a variety of substrate films, and with a variety of stepper illumination configurations. The results of the work done on the test structures may be compared to simulation results in order to tune the simulator for a particular technology and yield designs that are right the first time. However, simulators often do not accurately predict what gets printed when a reticle is put into service.

There are a number of potential sources of error in the process of calibrating a reticle simulator. Such sources may include insufficient accuracy in the stepper parameters, resist parameters and reticle dimensions.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

SUMMARY OF THE INVENTION

Disadvantages associated with the prior art are overcome by embodiments of the present invention directed to a photomask reticle and a method for calibrating a computer program that simulates a physical process. In the method, a first physical artifact may be exposed to the physical process to produce a second physical artifact. The first physical artifact may include one or more features characterized by traceably measured known dimensions. One or more features of the second physical artifact may be traceably measured to produce one or more traceably measured dimensions with a known uncertainty. The physical process may be simulated with a computer simulation using the known dimensions of the first physical artifact as inputs to produce an output. The output may be compared to the measured dimensions of the second physical artifact to produce a result. A figure of merit may be assigned to the computer simulation based on the result.

The inventive method may be implemented using a photomask as the first physical artifact. The photomask may have one or more features with one or more traceably measured dimensions.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
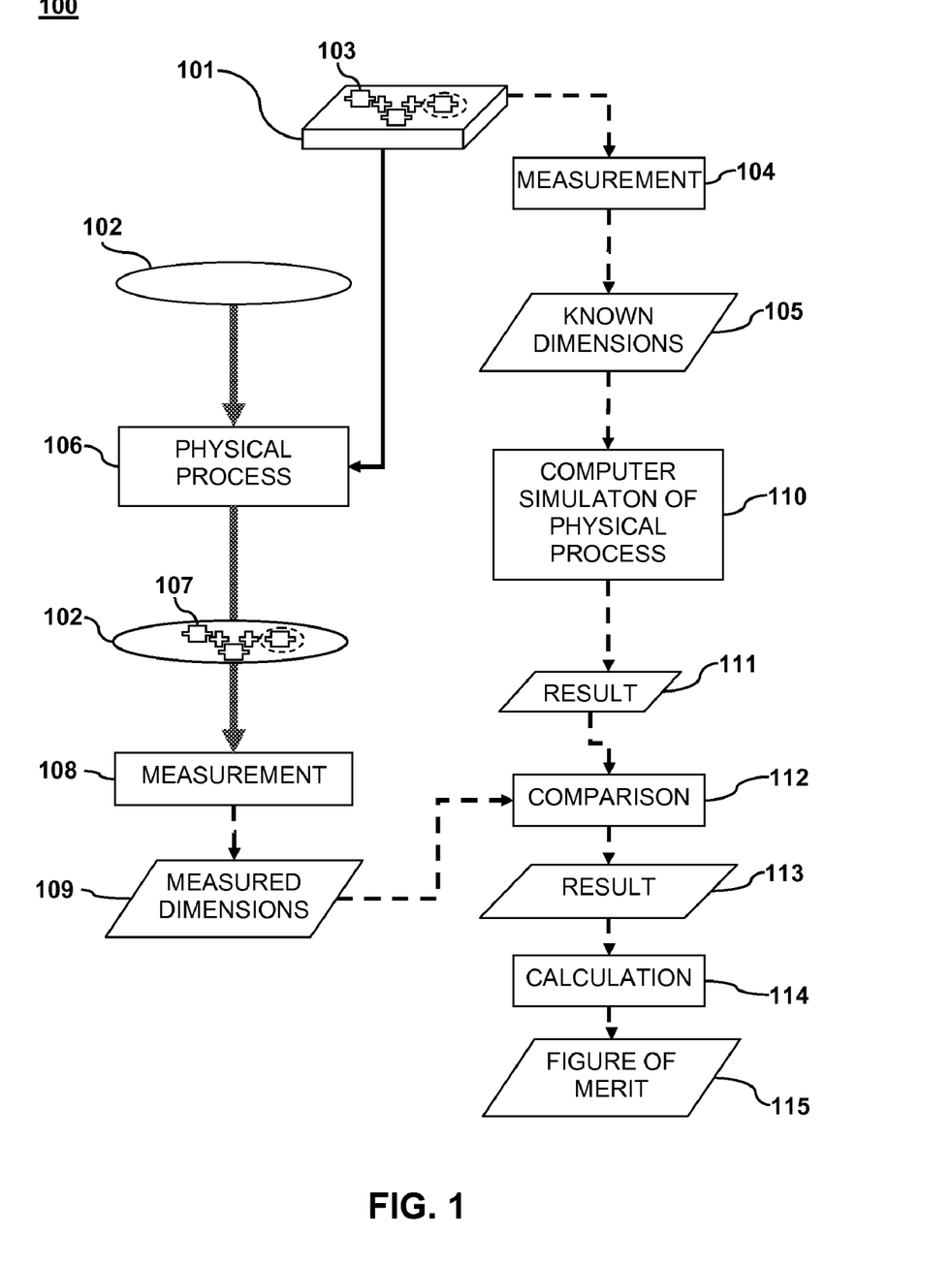
FIG. 1 is a flow diagram illustrating a method for calibrating a computer program that simulates a physical process according to an embodiment of the present invention.

FIG. 1 depicts a flow diagram illustrating a method 100 for calibrating a computer simulation 110 of a physical process 106 according to embodiments of the present invention. According to the method 100 a first physical artifact 101 having one or more features 103 is used in the physical process 106 to produce or modify a second physical artifact 102 with one or more features 107. The one or more features 103 of the first physical artifact 101 are characterized by known dimensions 105 that have been measured to be traceable to one or more internationally recognized standards within a known uncertainty. The known uncertainty in the known dimensions 105 may be less than about 5 nanometers, e.g., about one nanometer. The known dimensions 105 may be obtained by performing a traceable measurement 104 of the features 103. The measurement 104 may include measuring the features 103 with a critical dimension atomic force microscope (CD-AFM).

As used herein, a measurement is said to be "traceable" or "traceably measured" if the measurement can be related to a fundamental unit through an uninterrupted chain of comparisons where each comparison has an associated uncertainty. By way of example, a measurement may be considered traceable to an internationally recognized standard if the measurement has been made with a measurement tool or system calibrated with a standard reference material having one or more dimensions that are traceable to a standard at a national or international testing authority. Artifacts whose properties are traceable to fundamental quantities (e.g. speed of light, angle, wavelength of cesium etc.), an atomic lattice spacing or a molecular standard may also be regarded as "traceable" standards. Examples of molecular standards are described e.g., in U.S. patent application Ser. No. 11/020,421, which is incorporated herein by reference. Examples of national testing authorities include, but are not limited to national laboratories such as the National Institute of Standards and Technology (NIST—Gaithersburg, Md., US), the Institute for National Measurement Standards (Montreal, Canada), the National Institute of Metrology (Beijing, China), the Bureau National de Metrólogié (Paris, France), the Federal Institute for Materials Research and Testing (BAM—Berlin, Germany), The National Physics Laboratory (New Delhi, India), the Istituto di Metrologia "G. Colonnetti" (IMGC—Torino, Italy), the National Metrology Institute of Japan (Ibaraki, Japan) and the National Physical Laboratory Center for Basic Metrology (Teddington, UK). Examples of international testing authorities include, but are not limited to, the Bureau International des Poids et Mesures (BIPM—Sevres Cedex, France) and the International Organization of Legal Metrology (OIML—Paris, France). In addition, national and international testing authorities may also include other laboratories delegated by the national or international testing authorities. Examples of traceable standards for use in measurement tools commonly used in semiconductor wafer processing are described, e.g., in U.S. Pat. No. 6,646,737 the entire contents of which are incorporated herein by reference. Additional examples of traceable standards are described in U.S. patent application Ser. No. 10/770,151, which is incorporated herein by reference.

The known dimensions 105 may be used as inputs to a computer simulation 110 that simulates the physical process 106 and produces an output 111. The computer simulation 110 may simulate the printing of the one or more features 107 of the second physical artifact 102 using the photomask reticle 101. The output 111 may include a representation of one or more simulated features corresponding to the one or more of the features 107 of the second physical artifact. The output 111 may include calculated values of dimensions for such simulated features. The known dimensions 105 may include traceable uncertainties in the dimensions. Specifically, such traceable uncertainties may include a combination of an uncertainty in a traceable standard used to calibrate a metrology tool used to determine the known dimensions 105 and an uncertainty introduced by the metrology tool itself.

After the features 107 have been formed on the second physical artifact 102 a second measurement 108 may take place in which one or more of the features 107 of the second physical artifact are measured to produce one or more measured dimensions 109. The second measurement 108 may be either traceable or non-traceable. For example, the first physical artifact 101 may be a photomask that prints a feature on a substrate. Confirmation that the feature on the photomask has been printed on the substrate is but one of many possible examples of a non-traceable second measurement 108. Traceable measurements may be made at 108 such that the measured dimensions 109 are traceable to one or more internationally recognized standards within a known uncertainty. The known uncertainty in the measured dimensions 109 may be less than about 5 nanometers, e.g., about one nanometer. The measurement 108 may include measuring the features 107 with a critical dimension atomic force microscope (CD-AFM). By way of example, and without loss of generality, the features 107 of the second physical artifact 102 may include a line feature and traceably measuring the features 107 may include generating a cross-section of the line feature. The measured dimensions 109 may include traceable uncertainties in the dimensions. Specifically, such traceable uncertainties may include a combination of an uncertainty in a traceable standard used to calibrate a metrology tool used to determine the measured dimensions 109 and an uncertainty introduced by the metrology tool itself.

Once the output 111 and the measured dimensions 109 have been obtained, a comparison 112 may be performed. In the comparison 112, the output 111 of the computer simulation 110 may be compared against the measured dimensions 109 to produce a result 113. The result may be subjected to a calculation 114 that produces a figure of merit 115. The figure of merit 115 generally provides an indication of the level of agreement between the output 111 of the simulation and the measured dimensions 109. By way of example, and without loss of generality, the comparison 112 may compare one or more dimensions of the simulated features described above to a corresponding one or more of the measured dimensions 109. The result 113 may include differences between the measured dimensions 109 and dimensions of corresponding simulated features produced by the computer simulation 110. The calculation 114 may involve adding the differences in quadrature (taking a square root of a sum of the squares of the differences) to produce the figure of merit 115. In addition, the calculation 114 that assigns the figure of merit 115 may propagate an uncertainty in the known dimensions and the measured dimensions, e.g., by taking a square root of a sum of the squares of the uncertainties in the known and measured dimensions. In some embodiments, the comparison operation 112 and calculation operation 114 may be combined into a single operation to produce the figure of merit 115.

By way of example, the first physical artifact 101 may be a photomask reticle and the second physical artifact 102 may be a substrate suitable for forming a semiconductor integrated circuit, microelectromechanical system (MEMS) device or photonic device. By way of example, the features 103 on the first physical artifact 101 may include a pattern of opaque, transparent or optical phase shifting regions on a photomask substrate. The photomask substrate may be made of a suitable material, such as quartz. The features 107 on the second physical artifact 102 may correspond to one or more of the features 103 on the first physical artifact. By way of example, the process 106 may be a photolithographic process that uses a photomask 101 to project photomask pattern features 103 onto a layer of resist formed on a substrate 102. By exposing the resist to radiation through the photomask 101, removing portions of the resist that either have been or have not been exposed to the radiation and performing a subsequent etching or deposition on exposed portions of the substrate 102, the photomask pattern features 103 may be transferred to the substrate to form features 107 on the substrate. This process may be simulated for a given photomask using a suitable computer simulation 110. By way of example, the computer simulation 110 may be implemented, in whole or in part, using a commercially available software. Examples of commercially available software for simulating, e.g., photolithographic processes include, among others, Prolith from KLA-Tencor of San Jose, Calif., Solid E from Synopsis, Inc. of Mountain View, Calif., or Tachyon from Brion Technologies Incorporated of Santa Clara, Calif. By way of example, the known dimensions 105 may include a line width, a step height, an optical transmission or some combination of two or more of these. By way of example, the measured dimensions 109 may include a line width, a step height, an optical transmission or some combination of two or more of these.

Figure 2:
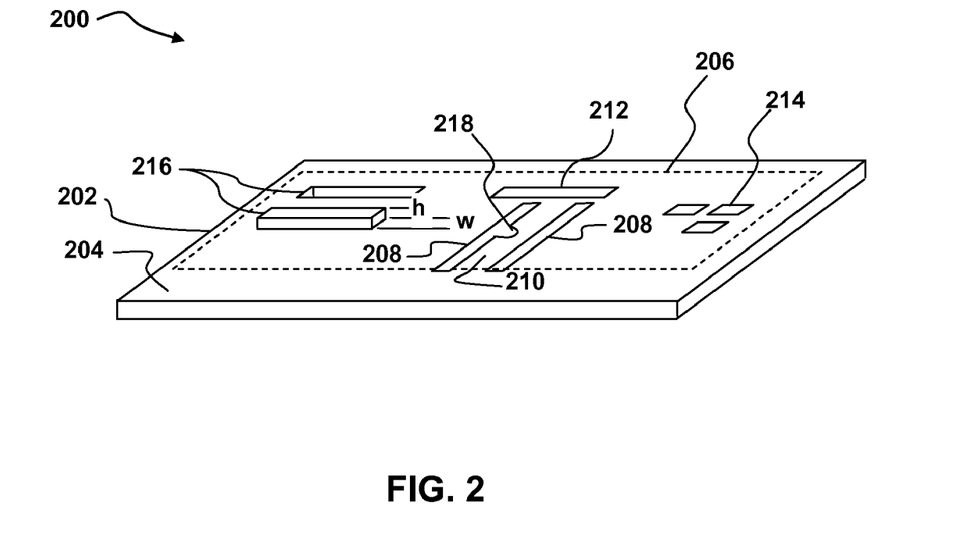
FIG. 2 is a three-dimensional schematic diagram of a photomask reticle according to an embodiment of the present invention.

FIG. 2 depicts an example of a calibrated photomask reticle 200 that may be used in conjunction with embodiments of the present invention. The photomask 200 generally includes a substrate 202 having a patterned surface 204. The patterned surface includes one or more features 206 characterized by dimensions that have been measured to be traceable to one or more internationally recognized standards within a known uncertainty. By way of example, the features 206 may form a pattern configured for fabricating a layer of a semiconductor integrated circuit, a microelectromechanical system (MEMS) device or a photonic device on the second physical artifact.

By way of example, the substrate 202 may be made of an optically transparent material, such as quartz or calcium fluoride ($CaF_2$). The features 206 may include regions of opaque material 208 with transparent gaps 210. The opaque material may be a metal such as chrome deposited on the surface 204 in a pattern. Such opaque material may be in the form of one or more lines 212 characterized by a line width w and a line thickness (or step height) h. The lines 212 may be either raised above the level of the surface 204 or recessed below it, e.g. in the form of trenches of depth h. The dimensions w and h may be traceably measured to an uncertainty within about 5 nanometers, e.g., using a CD-AFM. The CD-AFM may be calibrated against a standard such as, e.g., a NanoCD linewidth standard available from VLSI Standards, Inc. of San Jose, Calif., which is traceable to the International System of Units through the atomic lattice spacing of silicon. The features 206 may include test features 214. Such test features may serve to form corresponding test structures on a substrate. The test structures may be used to assist measurements performed on the substrate after they have been formed. Examples of such test structures include alignment targets, such as box-in-box or grating type overlay targets.

It is sometimes desirable to determine an optical transmission coefficient for the substrate 202 or one or more regions of the substrate, such as the gaps 210. Such optical transmission coefficients may be measured to be traceable to one or more internationally recognized standards within a known uncertainty. Optical transmission coefficients may be measured, e.g., using a spectrophotometer. Spectrophotometers are suitable for measuring optical transmission of photomasks. An example of a suitable commercially available spectrophotometer is a Varian's Cary 4000 from Varian, Inc. of Palo Alto, Calif. Other suitable spectrophotometers are available from Hitachi High Technologies, and Shimatsu Scientific Instruments. Such a tool may be calibrated against a suitable standard that is traceable to an internationally recognized standard. By way of example, to make the optical transmission measurements on a spectrophotometer traceable to an internationally recognized standard, the spectrophotometer may be calibrated with a standard reference material (SRM) available from National Institute of Standards and Technology (NIST). One SRM suitable for this purpose is SRM 2031a. Such a reference material may be obtained with NIST-certified optical transmission values at a series of wavelengths in visible and ultra-violet (UV) ranges.

The features 206 may also include one or more step regions 216 in which a height h of the surface 204 varies abruptly compared to surrounding regions. Such regions, sometimes referred to herein as steps, may be formed by selectively etching the surface 204 to form raised or depressed regions. It is noted that such steps may also form lines, which may be characterized by a width w and step height h. Step regions in the surface 204 are sometimes used to introduce a difference in phase between radiation passing through different portions of the photomask reticle 200. Line widths and depths of features 206 may be calibrated by comparing them against traceable standards, examples of which are described in U.S. Pat. No. 6,646,737 and U.S. patent application Ser. No. 10/770,151, both of which have been incorporated herein by reference. It is noted that even relatively small variations in the dimensions of certain types of features 206 can have a big impact on whether or not a particular feature on the reticle 200 will be printed. For example, depending on the wavelength of radiation used for photolithography, a certain semicircular feature 218 may print if its diameter is about 150 nanometers, but may not print at all if the diameter is 140 nanometers. Thus, a difference of as little as 10 nanometers may make the difference between whether a given feature will be printed or not.

Figure 3:
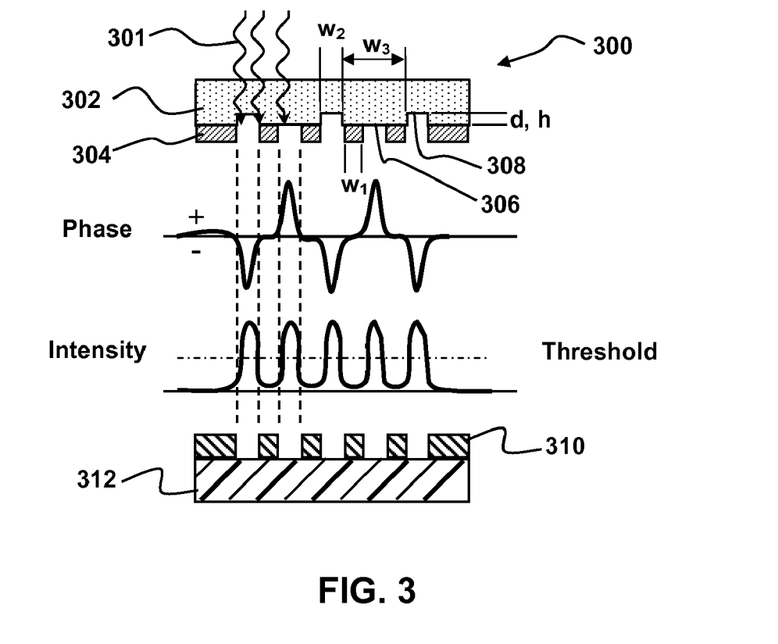
FIG. 3 is a cross-sectional schematic diagram illustrating the use of a calibrated alternating phase shift mask (altPSM) according to an embodiment of the present invention.

There are a number of different photomask types that may be used in embodiments of the present invention. FIG. 3 illustrates the use of a type of photomask referred to as an alternating phase-shift mask (altPSM) 300 according to an embodiment of the present invention. The altPSM 300 uses alternating areas of opaque material, e.g., chrome, of width $w_1$ and 180 degree phase-shifted regions to form features on a wafer 312 that is covered by a layer of a resist 310. The altPSM 300 generally includes a mask substrate 302 made of a material, e.g., quartz or $CaF_2$, that is transparent to radiation 301. The material of the substrate 302 may be characterized by an optical transmission coefficient T. The radiation passing through the altPSM 300 is imaged onto the resist layer 310 using an imaging system commonly known in the art. If the intensity at the radiation 301 impinging on the resist 310 is greater than a threshold, the resist will react. Opaque lines 304 on a mask substrate 302 are bordered on one side by regions 306 of the surface of the mask substrate of phase 0°, and on the other side by regions 308 of the surface of the mask substrate 302 that have been etched to a depth d corresponding to a phase shift of 180° for the radiation 301 that passes through the altPSM 300.

The 0° regions 306 may be regions of a polished surface of the mask substrate 302. The 180° regions 308 may be in the form of trenches of depth d and width $w_2$ formed into the polished surface of the mask substrate 302. Alternatively, the 180° regions may be raised regions (e.g., steps) of height h and width $w_3$ formed on the polished surface. One or more of the depth d, height h widths $w_1$, $w_2$, $w_3$ and optical transmission coefficient T may be traceably measured to internationally recognized standards as described above. Radiation passing through 0° regions 306 and 180° regions 308 interfere at the photoresist 310. As the phase goes from positive to negative, it passes through 0. The intensity (which is proportional to the square of the phase) of radiation impinging on the resist 310 also goes through 0, making a very dark and sharp line on the wafer 312 when the resist 310 is developed and the wafer 312 is etched. It is noted that the phase shift depends partly on the depth or height of the various regions on the surface of the substrate mask 302. Consequently, it is useful to know such heights or depths to within a high degree of certainty, e.g., to within about 5 nanometers or, more preferably, within about 1 nanometer.

Figure 4:
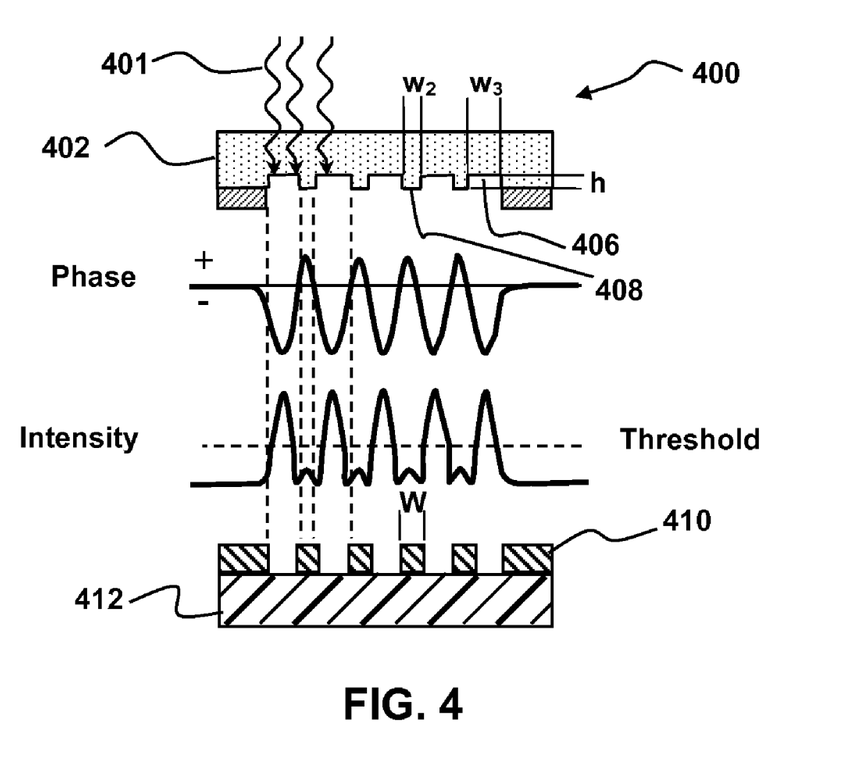
FIG. 4 is a cross-sectional schematic diagram illustrating the use a chromeless phase lithography (CPL) mask according to another embodiment of the present invention.

In an alternative embodiment of the invention, a calibrated photomask according to an embodiment of the invention may be used for chromeless phase lithography. In a chromeless phase lithography (CPL) mask features are formed on the wafer by diffraction edges between neighboring regions on the mask that are 180 degrees out of phase. FIG. 4 depicts the use of a calibrated CPL mask 400, where each shifted feature on the mask forms a line on a wafer 412 covered by a resist 410. The mask 400 generally has a substrate 402 with a surface and a pattern of 0° regions 408 and 180° regions 406 (e.g., trenches of width $w_3$ or raised regions of width $w_2$). The 180° regions 406 are at different heights h than the 0° regions 408. Radiation 401 imaged from different regions of the mask 400 interferes at the photoresist layer 410. By forcing the phase to go through 0, the intensity (which is proportional to the square of the phase) also goes through 0, making very dark and sharp lines of width W on the wafer 412 when the resist 410 is developed and the wafer 412 is etched.

Figure 5:
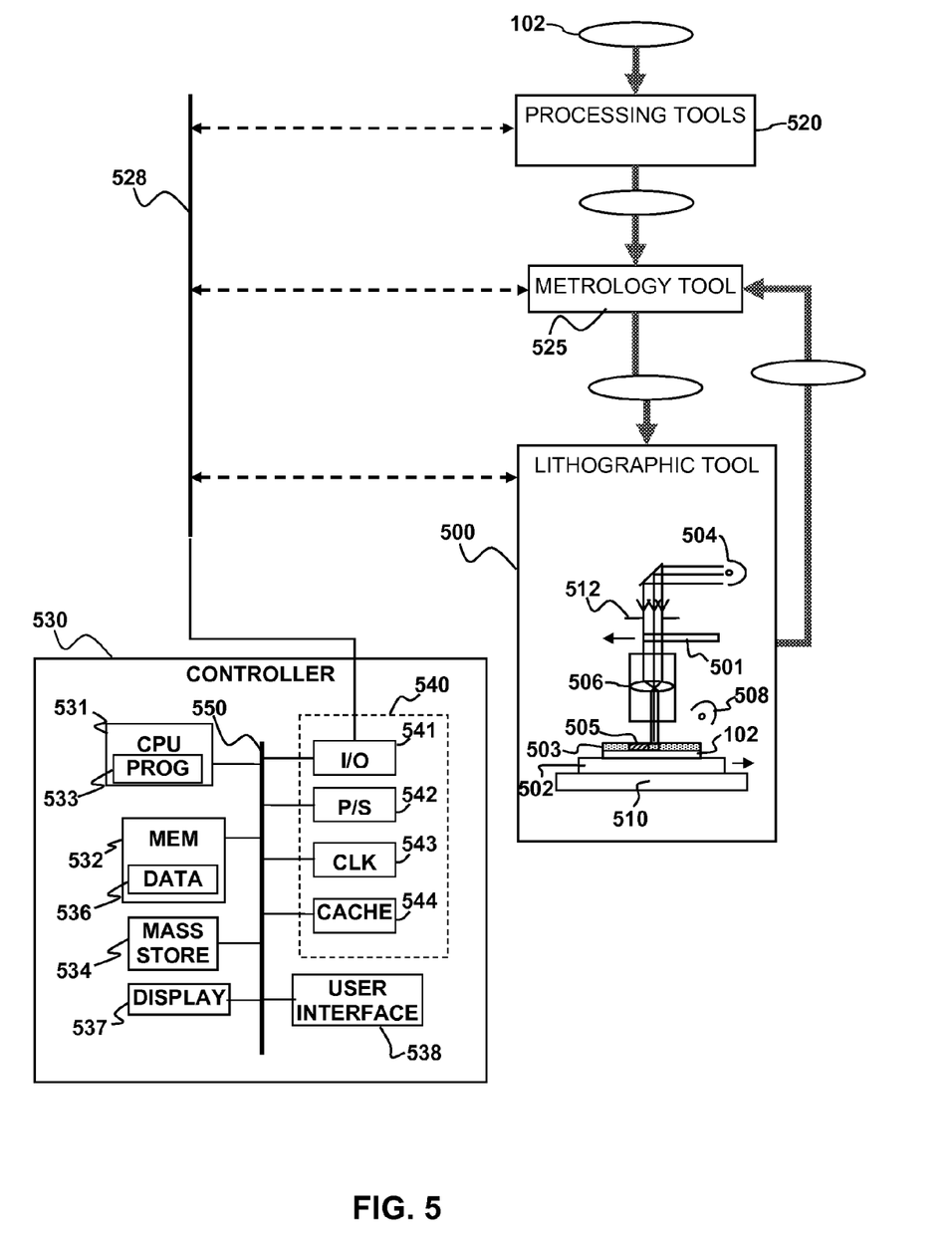
FIG. 5 is a block diagram of a version of a semiconductor fabrication system implementing photolithography using a calibrated photomask reticle according to an embodiment of the present invention.

Photomasks of the types described above may be used in a lithographic patterning tool according to an embodiment of the present invention. As shown in FIG. 5, a photolithographic tool 500 may incorporate a calibrated photomask and a printing tool such as a scanner or stepper as illustrated in FIG. 5. Such printing tools are similar in operation to a slide projector or a photographic enlarger. Such tools are often used in photolithographic processes used to form microscopic circuit elements on the surface of a semiconductor wafer. Although a stepper/scanner is shown and described herein for the sake of example, calibrated photomask reticles as described herein may be used in conjunction with other lithographic techniques such as nano-imprint lithography.

In the pattering tool 500, a substrate 102 is retained on a stage 502, which may include a chuck, e.g., a vacuum chuck or an electrostatic chuck. Elements of a circuit or other component to be created on the IC are reproduced in a pattern of transparent and opaque areas on the surface of a calibrated photomask reticle 501. The pattern on the reticle 501 may correspond to a pattern for a single die or chip of a semiconductor wafer having multiple such dies. Alternatively the pattern on the reticle 501 may correspond to a pattern for a MEMS or photonic device. Light from a source 504 passes through the reticle 501 and forms an image of the reticle pattern on the substrate 102. The image is focused and reduced by a lens 506, and projected onto the surface of a substrate 102 that is coated with a photoresist 503. The focused image on the resist 503 is often referred to as an exposure field 505. After exposure, the coated substrate 102 may be chemically developed, causing the photoresist 503 to dissolve in certain areas according to the amount of light the areas received during exposure. This transfers the pattern on the reticle 501 to the resist 503. The patterning tool 500 may be equipped with heater elements 508, such as heat lamps, to facilitate heating of the resist 503 either before or after exposure, e.g., to harden it. The patterning tool 500 may be a stepper with an alignment system 510 that moves the substrate 102 after exposing one die so that another portion of the substrate 102 may be exposed with the same exposure field 503. The patterning tool 500 may also be configured as a scanner. Scanners are steppers that increase the length of the exposure field 505 by moving the reticle 501 and stage 502 in opposite directions to each other during the exposure. Instead of exposing the entire field at once, the exposure is made through an "exposure slit" 512 that is as wide as the exposure field 505, but only a fraction of its length (e.g., a 9×25 mm slit for a 35×25 mm field). The image from the exposure slit 512 is scanned across the exposure area on the substrate 102.

The substrate 102 with the developed resist 503 may then be subject to further processing, e.g., etching or deposition. Such processes may take place in other processing tools 520. The photolithographic tool 500 may operate in conjunction with other tools in processing the substrate 102. Such other tools may include spin-coaters, which deposit the resist on the substrate 102 or pre-bake chambers, in which the resist is heated prior to exposure in the patterning tool 500. In addition, the other tools 520 may include a deposition tool, an etch tool, an ion implant tool, a resist application tool, a resist stripping tool, or a chemical mechanical planarization (CMP) tool. After one layer has been formed on the substrate 102, the substrate 102 may then be cleaned, recoated with photoresist, then passed through the patterning tool 500 again in a process that creates a structure, such as an integrated circuit, MEMS or photonic device on the substrate 102 layer by layer.

In embodiments of the present invention as described above, the photolithographic tool may be used in conjunction with one or more metrology tools 525. Such metrology tools may be used to make the measurements of dimensions of features formed by the photolithography tool. The resulting measured dimensions may then be used to calibrate a computer program that simulates a physical process. The physical process may be a photolithographic process that utilizes the tool 500. By way of example, and without limitation of embodiments of the invention, the metrology tool 525 may include an overlay tool, a thin film tool, such as a spectroscopic ellipsometer, an electron beam tool such as a critical dimension scanning electron microscope (CD-SEM), a probe-based microscopy tool, such as a CD-AFM, or scatterometry tool. By way of example, and without loss of generality, the metrology tool 525 may be a thin film metrology tool. Examples of such tools include optical thin film metrology tools, such as ellipsometer-, scatterometer- and interferometer-based tools. Alternatively, the metrology tool 525 may be based on electric sensors such as capacitive sensors that can measure variations in substrate height. By way of example, and without loss of generality, the metrology tool may be an optical thin film metrology system based on spectroscopic ellipsometry. An example of such a tool is a Spectra Fx 200 optical thin film metrology system from KLA-Tencor Corporation of San Jose, Calif. The metrology tool 525 may be calibrated against a standard that is traceable to an internationally recognized standard. By way of example, metrology tools used to measure line widths and depths of features formed on the substrate may be calibrated by comparison against traceable standards, examples of which are described in U.S. Pat. No. 6,646,737 and U.S. patent application Ser. No. 10/770,151, both of which have been incorporated herein by reference.

The photolithographic tool 500, other processing tool 520 and metrology tool 525 may operate in conjunction with a controller 530. The photolithographic tool 500, other processing tool 520, metrology tool 525 and controller 530 may exchange information in electronic form, e.g., via a system bus 528. The controller 530 may include a central processor unit (CPU) 531 and a memory 532 (e.g., RAM, DRAM, ROM, and the like). The CPU 531 may execute a process-control program 533, portions of which may be stored in the memory 532. The program may be configured, e.g., to calculate a figure of merit for a simulation of a process taking place in the tools 500, 520 by comparing a result of the simulation to measurements of features formed on the substrate 102 The memory may contain data 536 related to processes occurring in the tools 500, 520 and/or metrology performed by the metrology tool 525 on one or more substrates 102. Such data may be used by the program 533 to calculate the figure of merit. The controller 530 may also include well-known support circuits 540, such as input/output (I/O) circuits 541, power supplies (P/S) 542, a clock (CLK) 543 and cache 544. The controller 530 may optionally include a mass storage device 534 such as a disk drive, CD-ROM drive, tape drive, or the like to store programs and/or data. The controller 530 may also optionally include a display unit 537 and user interface unit 538 to facilitate interaction between the controller 530 and a user. The display unit 537 may be in the form of a cathode ray tube (CRT) or flat panel screen that displays text, numerals, or graphical symbols. The user interface 538 may include a keyboard, mouse, joystick, light pen or other device. The preceding components may exchange signals with each other via an internal system bus 550. The controller 530 may be a general purpose computer that becomes a special purpose computer when running code that implements embodiments of the present invention as described herein.

In a particular example, the tools 500, 520 may be used to form a multi-layer stack on the substrate 102 having two or more layers. A technique of the type described above with respect to FIG. 1 may be used to calibrate a simulation of the fabrication of the entire stack through calibration of simulations of each layer. Such a technique may be used to capture residual (unknown) errors.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for calibrating a computer program that simulates a physical process, comprising:
    exposing a first physical artifact to the physical process to produce a second physical artifact, wherein the first physical artifact includes one or more features characterized by known dimensions measured to be traceable to one or more internationally recognized standards within a known uncertainty;
    measuring one or more features of the second physical artifact to produce one or more measured dimensions;
    simulating the physical process with a computer simulation using the known dimensions of the first physical artifact as inputs to produce an output;
    comparing the output to the measured dimensions of the second physical artifact to produce a result; and
    assigning a figure of merit to the computer simulation based on the result, wherein the one or more features of the second physical artifact include a line feature and wherein traceably measuring the one or more features includes generating a cross-section of the line feature.

2. The method of claim 1, further comprising measuring the one or more features of the first physical artifact in a manner traceable to one or more internationally recognized standards within a known uncertainty to produce the known dimensions.

3. The method of claim 2 wherein measuring the one or more features of the first physical artifact includes measuring the one or more features with a critical dimension atomic force microscope (CD-AFM).

4. The method of claim 1 wherein assigning a figure of merit to the computer simulation based on the result includes propagating an uncertainty in the known dimensions and the measured dimensions.

5. The method of claim 1 wherein the one or more internationally recognized standards include an atomic lattice spacing.

6. The method of claim 1 wherein the known uncertainty in the known dimensions or measured dimensions is about 5 nanometers or less.

7. The method of claim 1 wherein measuring one or more features of the second physical artifact includes traceably measuring the features such that the measured dimensions are traceable to one or more internationally recognized standards within a known uncertainty.

8. The method of claim 1 wherein measuring one or more features of the second physical artifact includes traceably measuring the features such that the measured dimensions are not traceable to one or more internationally recognized standards within a known uncertainty.

9. The method of claim 1 wherein the output includes a representation of one or more simulated features corresponding to the one or more features of the second physical artifact.

10. The method of claim 9 wherein comparing the output includes comparing one or more dimensions of the simulated features to a corresponding one or more of the measured dimensions.

11. The method of claim 1, wherein the first physical artifact is a photomask reticle.

12. The method of claim 1, wherein the first physical artifact is a photomask reticle and wherein the physical process includes printing the one or more features of the second physical artifact with the photomask reticle.

13. The method of claim 12 wherein the computer simulation includes simulating the printing of the one or more features of the second physical artifact.

14. The method of claim 12 wherein the one or more measured dimensions include a line width and an optical transmission.

15. The method of claim 12 wherein the one or more measured dimensions include a line width and a step height.

16. The method of claim 12 wherein the one or more features of the second physical artifact include a pattern of photomask features for fabricating a layer of a semiconductor integrated circuit, microelectromechanical system (MEMS) device or photonic device on the first physical artifact.

17. The method of claim 1 wherein the physical process is a photolithographic process, whereby the computer simulation simulates the photolithographic process.

18. The method of claim 1 wherein the second physical artifact is a semiconductor wafer.

19. The method of claim 1 wherein the one or more measured dimensions include a line width and an optical transmission.

20. The method of claim 1 wherein the one or more measured dimensions include a line width and a step height.

21. The method of claim 1 wherein the one or more measured dimensions include an optical transmission and a step height.

* * * * *